(12) United States Patent
Yamazaki et al.

(10) Patent No.: US 7,468,310 B2
(45) Date of Patent: Dec. 23, 2008

(54) METHOD OF MACHINING SUBSTRATE AND METHOD OF MANUFACTURING ELEMENT

(75) Inventors: Yutaka Yamazaki, Suwa (JP); Kazushige Umetsu, Chino (JP)

(73) Assignee: Seiko Epson Corproation (JP)

( * ) Notice: Subject to any disclaimer, the term of this patent is extended or adjusted under 35 U.S.C. 154(b) by 309 days.

(21) Appl. No.: 11/300,108

(22) Filed: Dec. 14, 2005

(65) Prior Publication Data

US 2006/0134885 A1    Jun. 22, 2006

(30) Foreign Application Priority Data

Dec. 17, 2004    (JP) .............................. 2004-365516

(51) Int. Cl.
*H01L 21/00*    (2006.01)

(52) U.S. Cl. ................................ 438/463; 257/E21.599

(58) Field of Classification Search .................. 438/463
See application file for complete search history.

(56) References Cited

U.S. PATENT DOCUMENTS 6,121,118 A * 9/2000 Jin et al. ..................... 438/460

FOREIGN PATENT DOCUMENTS

| JP | 2002-192367 | 7/2002 |
| JP | 2002-205180 | 7/2005 |

* cited by examiner

*Primary Examiner*—David A Zarneke
(74) *Attorney, Agent, or Firm*—Harness, Dickey & Pierce, P.L.C.

(57) ABSTRACT

A method of machining a substrate etches a substrate according to a predetermined length and depth from an intersection between a first predetermined dividing line and a second predetermined dividing line, which cross each other in a T-shaped line, along the second predetermined dividing line of the predetermined dividing lines being used to cut the substrate, and divides the substrate along the predetermined dividing lines which are not etched by laser machining.

20 Claims, 6 Drawing Sheets

HIGH-PRECISION LASER PROCESS IS REQUIRED TO PROTECT OTHER ELEMENT REGION

FIRST EXPECTED CUTTING LINE

SECOND EXPECTED CUTTING LINE

10A

SET TO LEAVE 100·m

METHOD OF MACHINING SUBSTRATE AND METHOD OF MANUFACTURING ELEMENT

BACKGROUND

1. Technical Field

The invention relates to a method of machining a substrate to divide the substrate such as a wafer, which includes a laser-machining process such as scribing, and to a method of manufacturing a chip.

2. Related Art

For example, when chips having elements are manufactured from a substrate (wafer), there is a process for cutting the substrate, such as a silicon wafer, to divide the substrate into a plurality of chips. In this case, for example, there is a method of rotating a grindstone by dicing, cutting, and dividing the substrate. However, since this method uses liquid such as water and grinding fluid, this method cannot be used when elements which should not be wet are divided.

There is a laser-machining method of irradiating a laser beam to machine and divide a substrate in a predetermined shape. Particularly, in case of a laser-machining process, there are a method of cutting the substrate by forming grooves in desired portions, modifying property to be brittle, or expanding stress (for example, tension stress, bending stress, thermal stress, and the like) to break down the substrate, and a method of applying heat (energy) to melt a predetermined portion and cutting it (for example, JP-A-2002-192367 (FIGS. 1 and 2), JP-A-2002-205180 (FIGS. 1 and 2)).

However, in case of the laser-machining process, when there is a portion which should not be machined by a laser beam, for example, a step or a T-shaped portion, a high-precision laser-machining process and a high-precision laser-machining apparatus are required so as not to machine the portion. Accordingly, in case of the laser-machining process, which can not secure the high-precision, it is difficult to perform the laser-machining process.

SUMMARY

An advantage of some aspect of the invention is that is provides a method of machining (laser-machining) a substrate to divide the substrate more precisely and efficiently, and a method of manufacturing elements to be formed on the substrate on the basis of the machining method.

According to an aspect of the invention, a method of machining a substrate performs etching a substrate according to a predetermined length and depth from an intersection between a first predetermined dividing line and a second predetermined dividing line, which cross each other in a T-shaped line, along the second predetermined dividing line of the predetermined dividing lines being used to cut the substrate and dividing the substrate along the predetermined dividing lines which are not etched by laser machining.

According to the aspect of the invention, since the method performs etching a substrate to a predetermined length (including all cases of the second predetermined dividing line) and depth from an intersection between a first predetermined dividing line and a second predetermined dividing line, which cross each other in a T-shaped line, along the second predetermined dividing line, and the laser-machining, it is possible to reduce the time and cost and to efficiently machine the substrate, compared to a case where the intersection is not set to a starting or ending point of the laser-machining, and the same precision is realized only by the laser-machining. In addition, since it is not necessary to perform a very minute laser-machining even though the precision of laser-machining is not secured, it is possible to improve the yield of products manufactured from the substrate. Since the substrate is etched to a predetermined length and depth, it is possible to improve the yield when the etching is performed considering impact imposed on the substrate at the subsequent process.

According to another aspect of the invention, a method of machining a substrate includes etching a substrate according to a predetermined depth on a second predetermined dividing line, which crosses a first predetermined dividing line to form a T-shaped line, and on a predetermined dividing line, which is parallel to the second predetermined dividing line of the predetermined dividing lines being used to cut the substrate and dividing the substrate along the predetermined dividing lines which are not etched by the laser machining.

According to the aspect of the invention, since it is not necessary to perform the laser-machining for the predetermined dividing line parallel to the second predetermined dividing line, it is possible to reduce the time required for the laser-machining and the entire machining of the substrate. In particular, since the irradiation of a laser beam may not be controlled in some cases, it is possible to conveniently control the laser-machining.

The second predetermined dividing line may be arranged parallel to an orientation flat which is provided on a substrate having a predetermined crystal face orientation.

According to the aspect of the invention, since the predetermined dividing line is arranged parallel to the orientation flat, it is possible to maintain the intensity of the substrate with higher despite of the etching.

According to another aspect of the invention, a method of machining a substrate divides the substrate while leaving uncut a predetermined length from an intersection between a first predetermined dividing line and a second predetermined dividing line, which cross each other in a T-shaped line, along the second predetermined dividing line of the predetermined dividing lines being used to cut the substrate.

According to the aspect of the invention, the laser-machining is performed while leaving uncut a predetermined length from an intersection between a first predetermined dividing line and a second predetermined dividing line, which cross each other in a T-shaped line, along the second predetermined dividing line. Accordingly, when there is a portion that is not to be machined ahead of the intersection, it is possible to stop machining the substrate before reaching the intersection, and to apply stress to the substrate to divide the substrate.

The dividing the substrate by the laser-machining is performed while the predetermined length is set to 100 μm.

According to the aspect of the invention, the precision of the laser-machining is estimated and then the predetermined length is set. Accordingly, even though machining is deviated slightly, it is possible to divide the substrate correctly.

According to another aspect of the invention, there is provided a method of machining a substrate, which etches a predetermined length of a plurality of predetermined dividing lines from a predetermined point along the plurality of predetermined dividing lines, which are extended from the predetermined point and are not arranged in the same straight line of the predetermined dividing lines being used to cut the substrate and divides the substrate along the predetermined dividing lines which are not etched by the laser machining.

According to the aspect of the invention, since etching a predetermined length of a plurality of predetermined dividing lines from a predetermined point along the plurality of predetermined dividing lines, which are extended from the predetermined point and are not arranged in the same straight line, is performed, and the laser-machining is started or ended before the predetermined point, it is possible to improve the machining precision of the substrate. Two predetermined dividing lines, which are arranged on the same straight line, may be subjected to the laser-machining instead of being subjected to the etching.

The substrate may be formed of a silicon wafer.

According to the aspect of the invention, since the silicon wafer is used in forming elements such as semiconductor elements, it is efficient especially in an economic sense to use the silicon wafer for the etching process in the invention.

The dividing the substrate by the laser-machining is performed by moving the substrate with respect to a fixed laser irradiation point.

According to the aspect of the invention, it is possible to improve the machining precision compared to a case where a head for the laser-machining by moving the substrate.

The dividing the substrate by the laser-machining is performed by masking a part, which is not etched by the laser-machining.

According to the aspect of the invention, since the laser-machining is performed using the mask in addition to the substrate etching and the laser-machining, it is possible to machine the substrate with a higher precision even though controlling is not performed by the irradiation of the laser beam.

The irradiation of a laser beam on the substrate is controlled by pulse oscillation control of a Q switch.

According to the aspect of the invention, since the irradiation of the laser beam is controlled by the pulse oscillation control of a Q switch in addition to performing the etching and the laser-machining, it is possible to machine the substrate with a higher precision.

The irradiation of a laser beams on the substrate is controlled by opening or closing a shutter.

According to the aspect of the present invention, since the irradiation of the laser beam is controlled by the shutter in addition to performing the etching and the laser-machining, it is possible to machine the substrate with a higher precision.

The dividing the substrate by the laser-machining is for forming a groove or modifying property on the predetermined dividing line to divide the substrate by applying stress.

According to the aspect of the invention, since the groove is formed or property is modified using the above-mentioned method, it is possible to apply stress, such as expanding, efficiently and conveniently.

A through-groove is formed on the predetermined dividing line to cut the substrate.

According to the aspect of the invention, since the through-groove is formed using the above-mentioned method, it is possible to divide the substrate conveniently. In addition, when the stress is applied to divide the substrate, a low stress may be applied.

The dividing the substrate by the laser-machining for cutting or scribing the substrate is performed by irradiating a second or third harmonic of a YAG laser on the substrate.

According to the aspect of the invention, since the laser-machining for cutting or scribing is performed by irradiating a second or third harmonic of a YAG laser on the substrate, it is possible to conveniently divide the substrate without any deviation in the depth of the groove.

A fundamental wave of a YAG laser is irradiated on the substrate to divide the substrate by the laser-machining for modifying property of a portion of the substrate on which the YAG laser is irradiated.

According to the aspect of the invention, since the laser-machining for modifying property of a portion of the substrate on which the YAG laser is irradiated is performed using the fundamental wave of a YAG laser, it is possible to conveniently divide the substrate without any deviation in the property modification.

A condenser optical system for focusing a laser beam at a predetermined depth of the substrate is used for the dividing the substrate by the laser-machining.

According to the aspect of the invention, since the condenser optical system is used for the laser-machining, it is possible to machine the predetermined dividing line in a predetermined depth, regardless of the surface of or inside the substrate. In particular, it is efficient when condensing the laser beam to modify property of the inside of the substrate.

The laser beams diverged by a phase grating is irradiated on the substrate to divide the substrate by the laser-machining.

According to the aspect of the invention, since the phase grating is used for the laser-machining, it is possible to laser-machine the substrate on a plurality of predetermined dividing lines simultaneously, thereby reducing the time required for machining the substrate.

According to another aspect of the present invention, there is provided a method of manufacturing an element, which machines a substrate to cut the substrate into chips while a predetermined dividing line arranged in the lattice shape is set to the second predetermined dividing line according to an aspect of the invention, when dividing a plurality of elements arranged in a lattice shape on a substrate.

According to the aspect of the invention, since the above-mentioned method is used when a plurality of elements arranged in a lattice shape on a substrate is divided, it is possible to manufacture elements with a high precision without any deviation in the size of each element. In particular, when joining with another substrate or chip, the sizes match each other. Further, since the predetermined dividing line can be simultaneously etched when etching elements, it is possible to perform the above-mentioned method without increasing the machining time.

An element to be formed as a liquid droplet ejecting head is manufactured.

According to the aspect of the present invention, since the method is used to manufacture an element to be formed as a liquid droplet ejecting head, it is possible to join elements with a high precision. Accordingly, it is possible to manufacture a high-quality liquid droplet ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
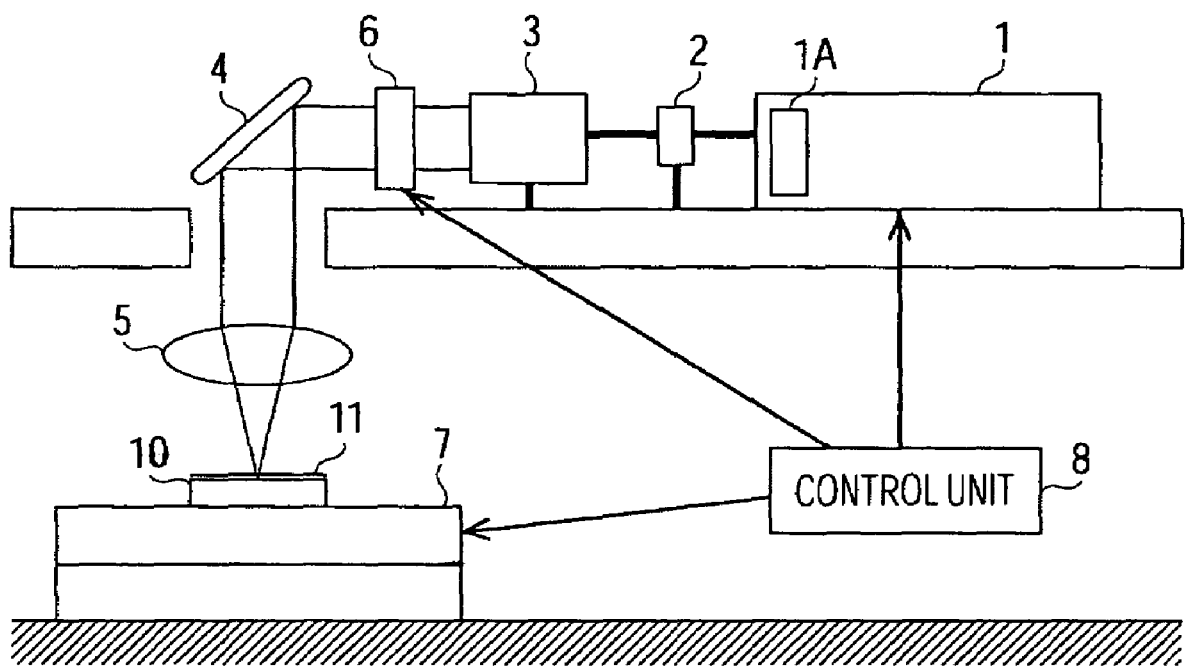
FIG. 1 is a diagram showing an embodiment of a laser-machining apparatus.

FIG. 1 is a diagram showing main units of a laser-machining apparatus for separating a substrate into chips (small parts) in accordance with a first embodiment of the invention. The embodiment describes a scribe process for forming a slender groove on a cutting line on the substrate (hereinafter referred to as a predetermined dividing line. The predetermined dividing line is basically a virtual line as an indication for a cut portion of the substrate, or an actual line) by applying stress to the substrate. In FIG. 1, a laser oscillator 1 is a device for oscillating a laser beam to machine a substrate 10. In the embodiment, a YAG (Yttrium-Aluminum-Garnet) laser oscillator is used as the laser oscillator 1. The embodiment describes a laser-machining process for performing a scribe process (a process for forming a slender groove) using harmonics (second and third harmonics) of the YAG laser, which is optimum for an expanding process.

The laser beam emitted from the laser oscillator 1 is adjusted by an attenuator 2. Further, the laser beam is adjusted by the laser beam expander 3 to be a collimated beam having a desired spot diameter. A reflection mirror 4 is a unit of a transmission optical system, which is provided to transmit the laser beam adjusted by the laser beam expander 3 to a condenser lens 5. Even though the laser beam is reflected by the reflection mirror 4 and sent to the condenser lens 5 in the embodiment, the laser beam may be sent using, for example, an optical fiber. The condenser lens 5 is a beam focusing unit of a condenser optical system (focus optical system), which is provided in a machining head (not shown) for the laser-machining process. The condenser lens 5 is provided to condense and irradiate the laser beam to a surface of or a predetermined position (depth) of the substrate 10. With the condenser optical system, it is possible to laser-machine the substrate 10 by condensing the laser beam with a predetermined depth of the substrate 10.

A shutter 6 controls the irradiation of the laser beam onto the substrate 10. Any kinds of shutters can be used if the shutters can only control the irradiation of the laser beam. In the invention, an electronic shutter is employed. With the electronic shutter having a high response speed, it is possible to control the irradiation of the laser beam with a high precision, and to machine the substrate 10 with a high precision. Instead of the shutter 6, a light-shielding mask 11 may be attached to a part of the substrate 10 on which the laser beam is not irradiated. In this case, it is not necessary to precisely control the irradiation of the laser beam. Also, the machining of the substrate 10 may be controlled using a Q switch 1A incorporated in the laser oscillator 1. A combination thereof may be used.

The substrate 10 is mounted on an XY table (stage) 7. It can move to two dimensions (in a direction parallel to a surface on which the laser beam is irradiated) by driving a driver (not shown in drawings), such as a motor, according to an instruction signal of a control unit 8. The position of the laser beam irradiated on the substrate 10 can be relatively moved, while a laser irradiating point (a laser spot) is fixed. Accordingly, a laser-machining process, such as scribing, property-modifying, or cutting, is possible. The control unit 8 controls the entire laser-machining apparatus. That is, the control unit 8 controls oscillation of the laser oscillator 1, moving of the XY table 7, opening and closing of the shutter 6, and the like. Even though not shown in the drawings, the respective controllers for controlling the laser oscillator 1, the XY table 7, and the shutter 6 are provided. The control unit 8 may issue instructions to the controllers to control the entire laser machining apparatus.

Figure 2A:
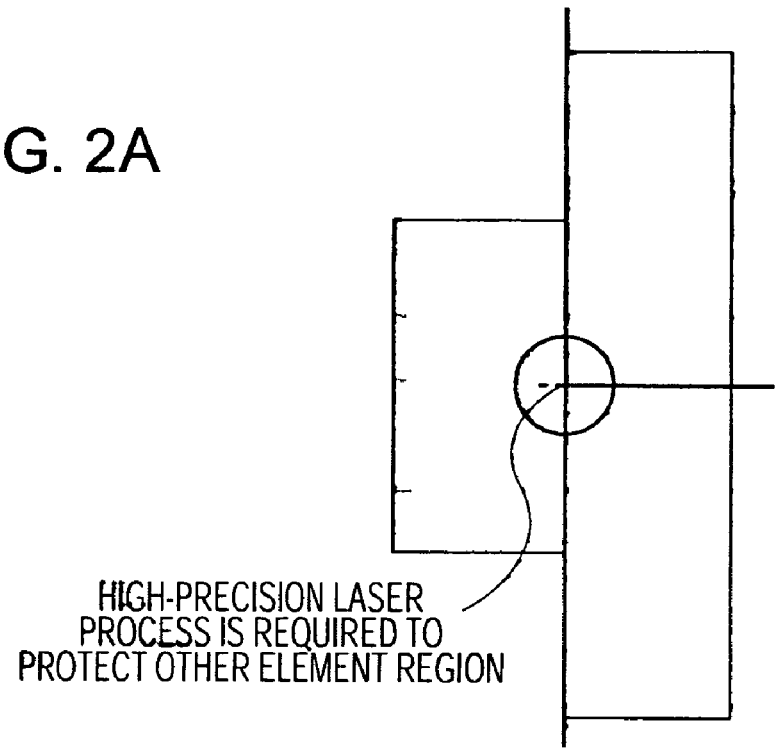
FIG. 2A is a diagram showing a part of a substrate to be machined.
Figure 2B:
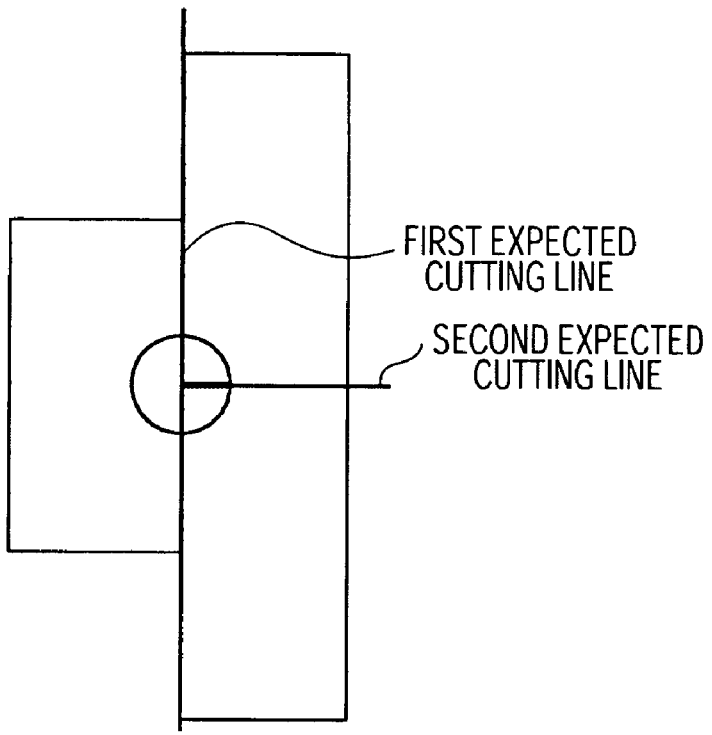
FIG. 2B is a diagram showing a part of a substrate to be machined.

FIG. 2 is a diagram showing a part of a substrate to be machined. In the embodiment, a plurality of components (for example, components for forming elements such as a liquid droplet ejecting head, which is an example of an inkjet head, semiconductor elements, and the like) is arranged in a lattice shape. In addition, the embodiment describes a process for dividing the substrate into chips, in which a planned parting line is drawn in a step shape or a T shape on the substrate. In case of a laser-machining process, when there is another element (chip) which should not be machined by a laser beam, a high-precision laser-machining apparatus is required so as not to machine the element (FIG. 2A). However, the region may be unintentionally machined. In the embodiment, before the laser-machining process for dividing the substrate, for example, scribing, property-modifying, or cutting, a groove is formed on a predetermined portion, which is not laser-machined on the predetermined dividing line (for example, a portion in which a chip is formed when an element is manufactured in the chip), by performing an etching process in order to prevent the portion from being machined (FIG. 2B). The predetermined portion in the embodiment implies, for example, a predetermined length of portion from an intersection between a first predetermined dividing line and a second predetermined dividing line, which cross each other in a T-shaped line, along the second predetermined dividing line. Further, the first and second predetermined dividing lines need not to be orthogonal to each other.

The groove, which is formed by the etching process, may be formed on one side or both sides of the substrate. Considering the cost or the like, the groove is formed by the etching process beforehand, thereby machining the substrate with higher precision compared to the laser-machining process. Accordingly, a portion in which the groove is formed needs not to be subjected to the laser-machining process. In addition, it is possible to control the irradiation of the laser beam (i.e., it is controlled whether or not the laser beam is irradiated to be enough to machine the substrate) with a sufficient time. Accordingly, a high-precision laser-machining apparatus is not required, and it is not necessary to form a mask, which is needed for the laser-machining process, very precisely.

Figure 3:
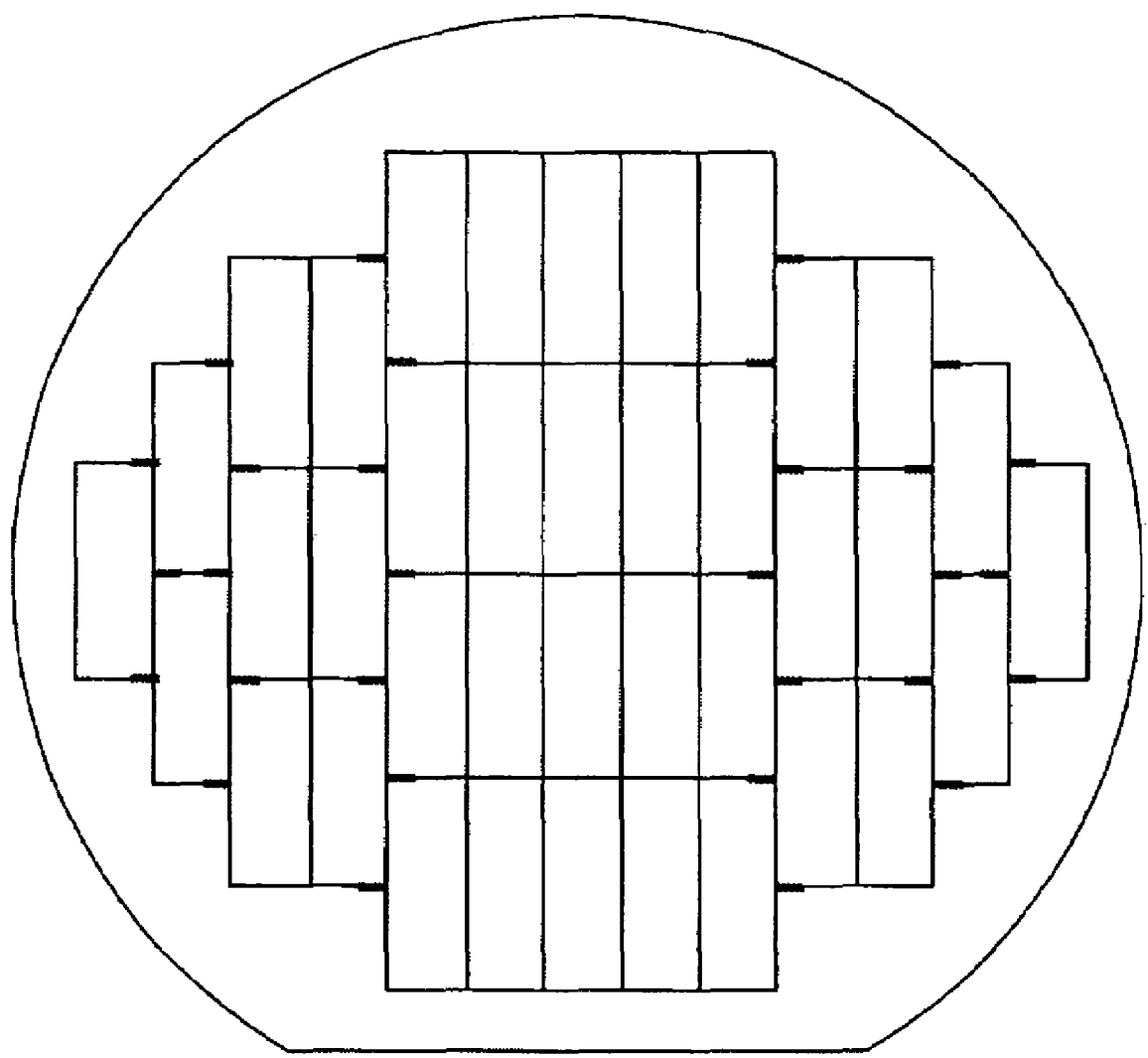
FIG. 3 is a diagram showing a substrate.

FIG. 3 is a diagram showing a substrate 10. In FIG. 3, a slender line in the substrate 10 indicates a predetermined dividing line. In the embodiment, the substrate 10 adopts a silicon substrate (wafer), which is widely used and suitable for the etching and laser-machining processes. The silicon substrate has, for example, a crystal face orientation of (110), and has an orientation flat which indicates the crystal face orientation of (110). A direction which is orthogonal to the orientation flat is adopted to cleave. Accordingly, when the etching process is performed along the direction and the groove (including through-groove) is formed along the direction, the substrate is very available to cleave when it is transferred or joined. Accordingly, it is preferred that a layout of chips on a substrate is designed such that the groove to be formed by etching is arranged in a direction parallel to the orientation flat.

In the embodiment, the volume of a substrate material (silicon) removed by etching should be as small as possible within the range of breakdown in order to secure a sufficient strength against breakage of the substrate. Although it is different according o a process-precious of the laser-machining apparatus, in terms of the machining precision of a laser-machining apparatus, a groove having a length of about 100 μm is used such that breakage of the substrate 10 is prevented and a portion that should not be machined is protected. A groove having a length of less than 100 μm may be used if the substrate 10 is not broken even though the laser-machining process is performed such that the groove has a length of less than 100 μm. On the contrary, a groove having a length of more than 100 μm may be used if it is guaranteed that the substrate 10 is not broken.

On the other hand, for the depth of the groove, the thickness of the substrate 10 and an expanding force are concerned. However, the depth of the groove is preferably more than 50% of the thickness of the groove to break the substrate (upon etching on both sides of the substrate, more than 50% of the total thickness of the groove). Even though the etching process is performed to form the through-groove in the embodiment, the shape formed by etching may be a hole having the predetermined depth instead of the groove when the substrate may be broken down.

Examples of a method of etching the substrate 10 include a wet etching method, which uses an alkaline solution such as KOH solution or HF, or a dry etching method, which uses RIE (Reactive Ion Etching). For example, in case of an anisotropic wet etching method, a $SiO_2$ film is formed on a surface of the substrate, a resist (mask), such as photoresist, is formed on the entire surface of the substrate 10, and patterning is performed using a reticle (photolithography method). In this case, when the etching process is performed on both sides of the substrate 10, both sides are patterned. After removing the SiO2 film from the substrate 10, the substrate 10 is soaked in the alkaline solution such as a KOH solution to perform an etching process during a predetermined time period. After that, the SiO2 film is peeled off.

Even though the etching process for forming the groove has been described in the embodiment, it is not necessary to perform an extra independent process to form the groove. For example, the etching process is simultaneously performed in an etching process for forming chips on the substrate 10, thereby reducing the process time and improving the machining efficiency.

Figure 4A:
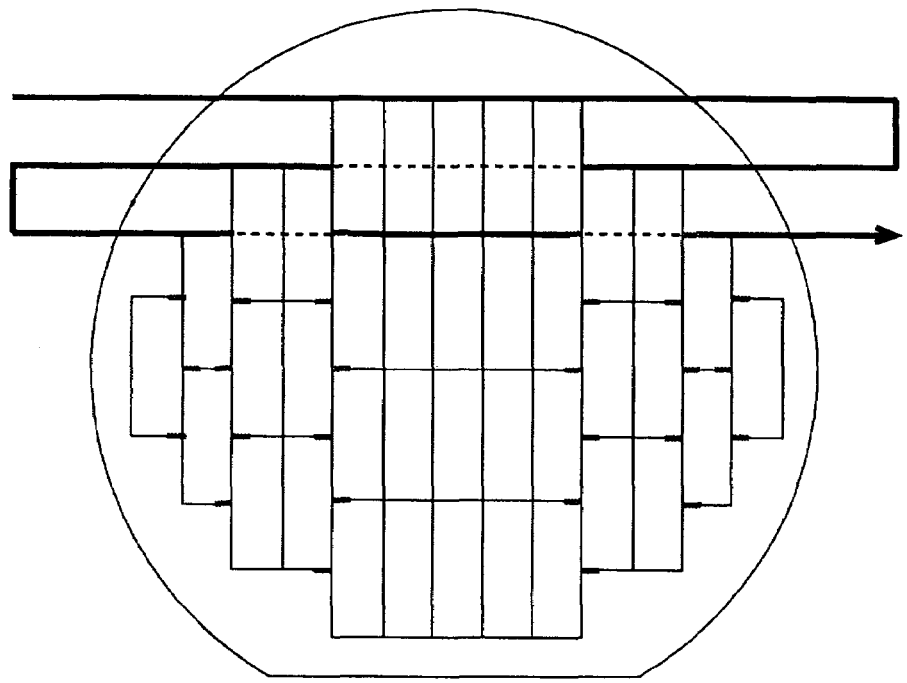
FIG. 4A is a diagram showing a laser-machining performed on a substrate.
Figure 4B:
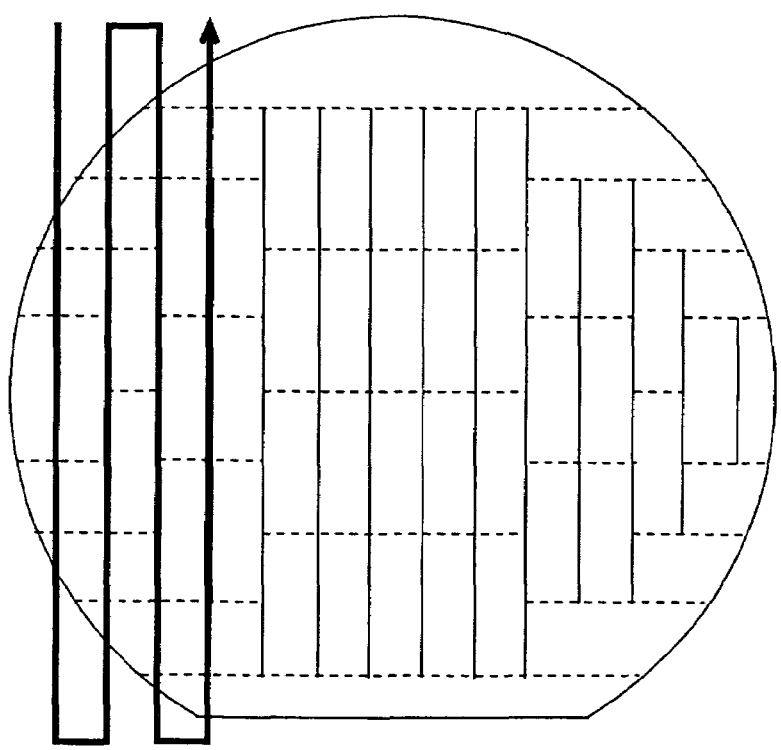
FIG. 4B is a diagram showing a laser-machining performed on a substrate.

FIG. 4 is a diagram showing a laser-machining process performed on the substrate 10. FIG. 4A shows a trajectory of a laser beam which is scanned (moved) in a direction parallel to an orientation flat. FIG. 4B shows a trajectory of a laser beam which is scanned (moved) in a direction perpendicular to the orientation flat. A thick line indicates a portion which is subjected to a laser-machining process, while a dotted line indicates a portion which is not subjected to a laser-machining process.

A laser beam outputted from the laser oscillator 1 passes through the attenuator 2 and the laser beam expander 3. Subsequently, the laser beam is reflected by the reflection mirror 4, condensed by the condenser lens 5, and irradiated on the substrate 10.

As the XY table 7 moves with respect to a fixed laser spot position, the substrate 10 moves relatively. Accordingly, it is possible to perform a laser-machining process on the substrate 10 according to the scribe. As shown in FIG. 4A, in a case where a portion to be subjected to the laser-machining process and a portion to be not subjected to the laser-machining process are provided intermittently, the shutter 6 is shut when a laser beam passes the portion to be not subjected to the laser-machining process, such that the laser beam is not irradiated on the substrate 10. On the other hand, as shown in FIG. 4B, in a case where the machining process is continuously performed, it is not necessary to shut the shutter 6. The control unit 8 coordinates and controls the laser oscillator 1, the shutter 6, and the XY table 7.

A plurality of chips are manufactured by applying stress, such as expanding, to the substrate 10 after laser-machining the substrate 10. In this case, for example, when an inkjet head is formed as an element, the inkjet head is joined to another substrate, on which another element is formed, and expanded.

As described above, according to the first embodiment, in a case that a high-precision laser-machining process is required (for example, in a case where a laser-machining process needs to be stopped at an intersection between T-shaped predetermined dividing lines), when the substrate 10 is divided into a plurality of chips by laser-machining the predetermined dividing lines of the substrate 10, a groove (including a through-groove) with a predetermined depth formed by etching is formed beforehand in a predetermined part at the intersection considering the precision of the laser-machining process. Accordingly, compared to a laser-machining process with the same precision, it is possible to improve the yield, to reduce the time and cost, and to efficiently machine the substrate 10 with a high precision. Since the process for forming the groove by etching can be simultaneously performed in an etching process performed upon forming elements, it is possible to save the time. Also, when a substrate having a crystal face orientation (for example, a silicon substrate having a crystal face orientation of (110)) is cleaved in the crystal face orientation, it is designed such that a groove is formed by etching along a predetermined dividing line which is arranged perpendicular to the crystal face orientation (for example, along a direction parallel to an orientation flat). Accordingly, the intensity of the substrate is significantly higher compared to a case where a groove is formed along the crystal face orientation. In addition, since the laser-machining process is performed while the XY table 7 (the substrate 10) moves with respect to a fixed laser spot, a high-precision laser-machining process is possible compared to a case where the laser spot moves with respect to a fixed substrate 10. In addition, a scribing process (a process for forming a slender groove) is performed using harmonics (second and third harmonics) of the YAG laser, it is possible to efficiently divide the substrate by an expanding process. While it is possible to perform a high-precision machining process by forming the groove through the etching process, the precision of the laser-machining process is improved in the embodiment by using the shutter 6, the Q switch 1A, and the mask 11 in addition to using the etching process. Accordingly, it is possible to improve the yield.

Second Embodiment

Figure 5:
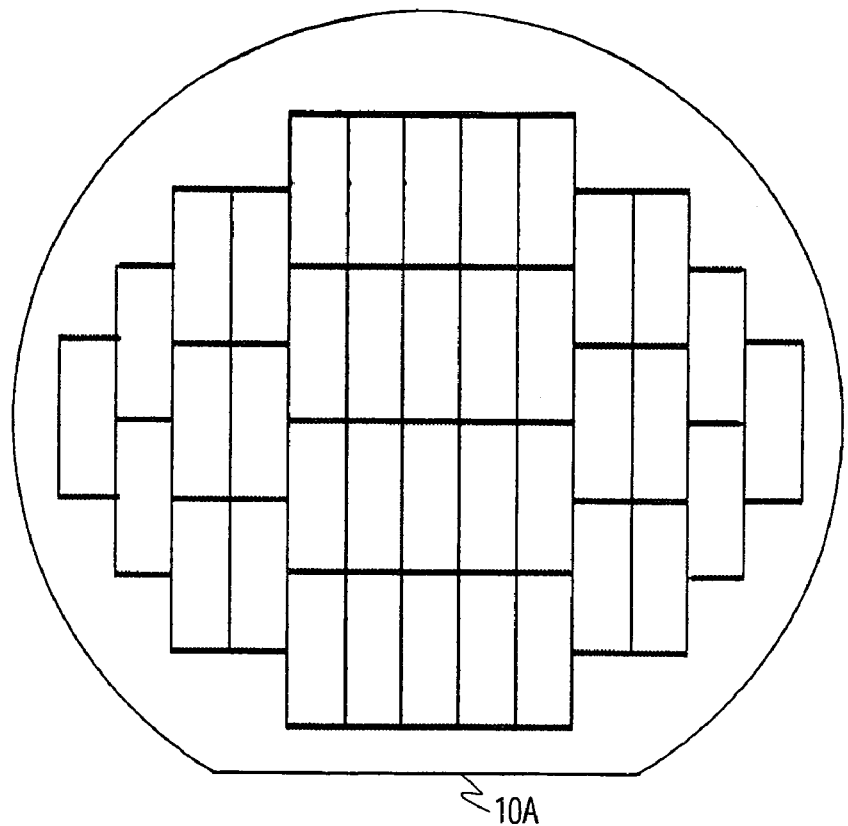
FIG. 5 is a diagram showing a substrate according to a second embodiment of the invention.

FIG. 5 shows a substrate 10A according to a second embodiment of the invention. In the above-mentioned first embodiment, a portion in which the groove is formed by etching is limited to a part of a second predetermined dividing line in order to secure the intensity against breakage of the substrate. However, it is not limited above-described embodiment. If the intensity against breakage of the substrate is only secured, grooves may be formed by etching on predetermined dividing lines parallel to the second predetermined dividing line (in this case, the entire predetermined dividing lines parallel to the orientation flat), as shown in FIG. 5.

In this case, since grooves are formed in a direction parallel to the orientation flat, the laser-machining process is not need to be processed (i.e., the laser-machining process in the direction of FIG. 4A can be omitted). Since the laser-machining process is required only in a direction perpendicular to the orientation flat as shown in FIG. 4B, it is possible to reduce the time required for machining (manufacturing) the substrate 10A. In addition, since it is not necessary to control the shutter 6 or the irradiation of the laser beam, it is possible to conveniently perform the laser-machining process.

Third Embodiment

Even though the groove is formed by the laser-machining process in the above-mentioned embodiments, the YAG laser oscillator may be used and the laser-machining process for modifying the property of the substrate may be performed using a fundamental wave of a YAG laser. It is possible to efficiently divide the substrate by modifying the property of the substrate by the laser-machining process to facilitate the expanding process and making tender the portion on which the predetermined dividing line is formed. It is possible to divide the substrate without performing the expanding process according to a machining method.

In addition, even though the laser-machining process for scribing has been performed using harmonic waves (second and third harmonic waves) of the YAG laser in the first embodiment, for example, the laser-machining process for cutting may be performed. In addition to the YAG laser, a $CO_2$ laser oscillator, a CO laser oscillator, or an excimer laser oscillator may be used. The type of laser oscillator and the type of laser beam are not limited if the laser-machining process can be performed.

Fourth Embodiment

Figure 6:
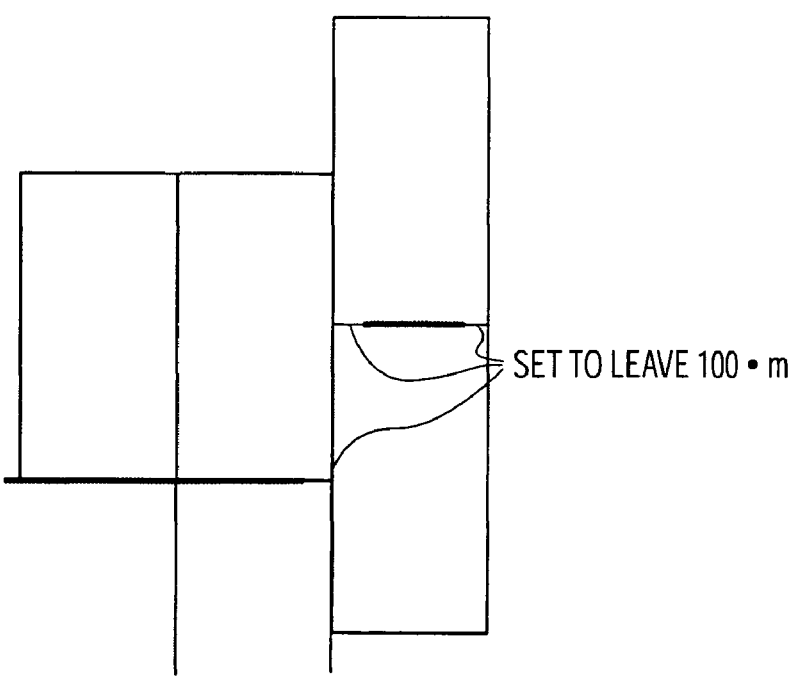
FIG. 6 is a diagram showing a part of a substrate to be machined according to a fourth embodiment of the invention.

FIG. 6 shows a part of a substrate to be machined according to a fourth embodiment. The embodiment describes a case that only the laser-machining process is performed while leaving the portion subjected to the etching process in the first embodiment. Even though it is different according to the thickness of the substrate, in case of a substrate on which a member constituting a liquid droplet ejecting head is formed, it is possible to expand it without affecting the element even though a portion which is not subjected to a machining process has a length of 200 μm.

In the first embodiment, after estimating the precision of laser-machining, a portion to be subjected to the etching process has been set to 100 μm. Also in the embodiment, a portion to be not subjected to the laser-machining process is set to 100 μm. In this case, for example, even though the laser-machining process is deviated by 100 μm, a region of other element is not subjected to the laser-machining process since more than 0 is left. In addition, it is possible to form a groove to be expanded since less than 200 μm is left. In this case, after dividing each substrate into a plurality of chips, a process for adjusting the divided surface may be added.

Fifth Embodiment

Figure 7:
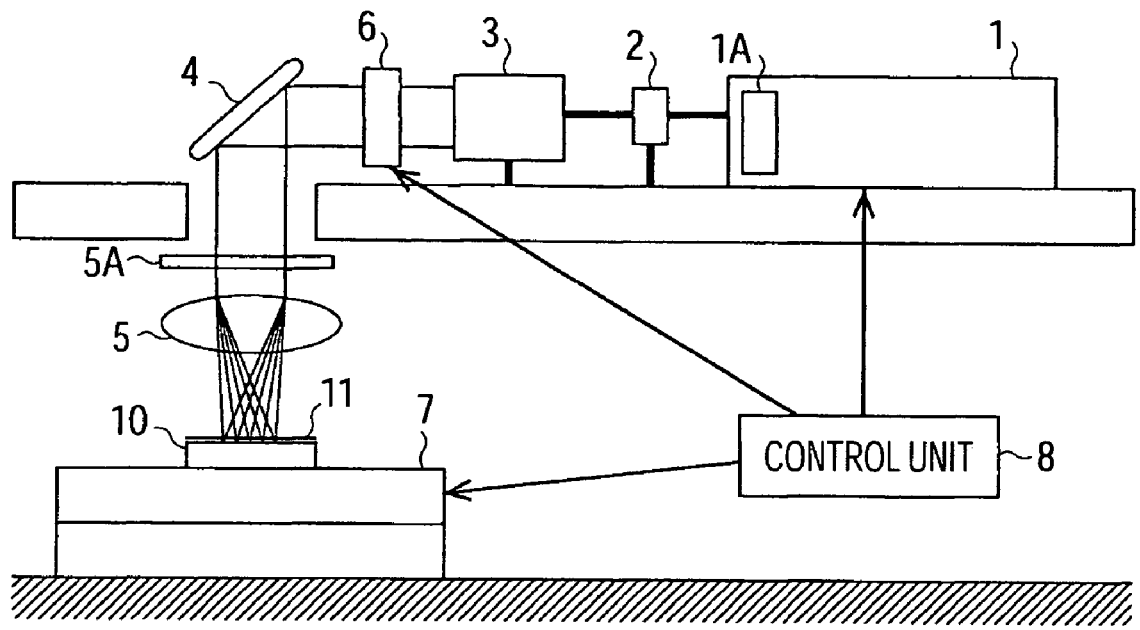
FIG. 7 is a diagram showing an example of a laser-machining apparatus according to a fifth embodiment of the invention.

FIG. 7 is a diagram showing an example of a laser-machining apparatus according to a fifth embodiment of the invention. In FIG. 7, the components which are denoted by the same reference numerals as those of the components shown in FIG. 1 have the same functions as the components of FIG. 1, and a detailed description thereof will thus be omitted. In the embodiment, a phase grating 5A is provided between the reflection mirror 4 and the condenser lens 5. The phase grating 5A changes the phase of incident light. Examples of the phase grating 5A include a surface phase grating, which has unevenness on its surface, and a volume phase grating whose index of refraction changes periodically. Since it is possible to indiscriminately design the shape or gap of the unevenness in the phase grating 5A, it is possible to design a laser beam with desired shapes and intervals. Accordingly, since it is possible to simultaneously perform the laser-machining process on a plurality of predetermined dividing lines, it is possible to reduce the machining time (the manufacturing time) of elements.

Sixth Embodiment

Figure 8A:
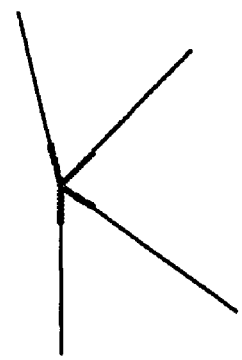
FIG. 8A is a diagram showing examples of a predetermined dividing line according to a method of dividing a substrate according to the invention.
Figure 8B:
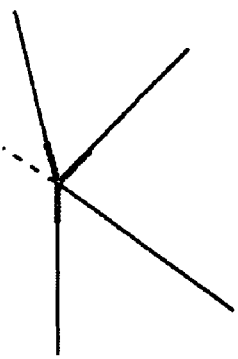
FIG. 8B is a diagram showing examples of a predetermined dividing line according to a method of dividing a substrate according to the invention.

FIG. 8 is a diagram showing examples of a predetermined dividing line according to a method of dividing a substrate according to a sixth embodiment of the invention. In the above-mentioned embodiments, the chip is cut in a square shape. However, the invention is not limited thereto, the chip may be cut in various shapes. When predetermined dividing lines (lines extending in different directions) are not arranged on the same straight line with respect to an intersection (i.e., when the predetermined dividing lines extend in different directions from each other), a predetermined portion from the intersection is subjected to the etching process. Accordingly, it is possible to machine the substrate with a high precision without performing a high-precision laser-machining process (FIG. 8A). Also, for example, when a region to which a laser beam proceeds along the predetermined dividing line may be machined, the etching process needs not to be performed on the predetermined dividing line (FIG. 8B).

Seventh Embodiment

Even though the substrate 10 and 10A is formed of silicon wafers in the first embodiment, the substrates are not limited thereto but may be formed of glass substrates, or wafers made of other materials. Also, a plurality of substrates may be laminated. In addition, elements formed on the substrate are not limited to elements for forming an inkjet head or semiconductors, but may be elements manufactured using a technology such as MEMS (Micro Electro Mechanical System), for example, a vibrator or the like.

What is claimed is:

1. A method of machining a substrate comprising:
   etching a substrate according to a predetermined length and depth from an intersection between a first predetermined dividing line and a second predetermined dividing line, which cross each other in a T-shaped line, along the second predetermined dividing line of the predetermined dividing lines being used to cut the substrate; and
   dividing the substrate along the predetermined dividing lines by laser machining the substrate.

2. A method of machining a substrate comprising:
   etching a substrate according to a predetermined depth on a second predetermined dividing line, which crosses a first predetermined dividing line to form a T-shaped line, and on a predetermined dividing line, which is parallel to the second predetermined dividing line of the predetermined dividing lines being used to cut the substrate; and
   dividing the substrate along the predetermined dividing lines by laser machining the substrate.

3. The method of machining the substrate according to claim 1, wherein the second predetermined dividing line is arranged parallel to an orientation flat which is provided on a substrate having a predetermined crystal face orientation.

4. A method of machining a substrate comprising etching the substrate to divide the substrate while leaving uncut a predetermined length from an intersection between a first predetermined dividing line and a second predetermined dividing line, which cross each other in a T-shaped line, along the second predetermined dividing line of the predetermined dividing lines being used to cut the substrate.

5. The method of machining the substrate according to claim 4, wherein the predetermined length is set to 100 μm.

6. A method of machining a substrate comprising:
etching a predetermined length of a plurality of predetermined dividing lines from a predetermined point along the plurality of predetermined dividing lines, which are extended from the predetermined point and are not arranged in the same straight line of the predetermined dividing lines being used to cut the substrate; and
dividing the substrate along the predetermined dividing lines by laser machining the substrate.

7. The method of machining the substrate according to claim 1, wherein the substrate is formed of a silicon wafer.

8. The method of machining the substrate according to claim 1, wherein the dividing the substrate by the laser-machining is performed by moving the substrate with respect to a fixed laser irradiation point.

9. The method of machining the substrate according to claim 1, further comprising masking a part of the substrate.

10. The method of machining the substrate according to claim 1, wherein the irradiation of a laser beam on the substrate is controlled by pulse oscillation control of a Q switch.

11. The method of machining the substrate according to claim 1, wherein the irradiation of a laser beams on the substrate is controlled by opening or closing a shutter.

12. The method of machining the substrate according to claim 1, wherein the dividing the substrate further comprises forming a groove or modifying property on the predetermined dividing line to divide the substrate by applying stress.

13. The method of machining the substrate according to claim 1, wherein a through-groove is formed on the predetermined dividing line to cut the substrate.

14. The method of machining the substrate according to claim 1, wherein the dividing the substrate by the laser-machining for cutting or scribing the substrate is performed by irradiating a second or third harmonic of a YAG laser on the substrate.

15. The method of machining the substrate according to claim 1, wherein a fundamental wave of a YAG laser is irradiated on the substrate to divide the substrate by the laser-machining for modifying property of a portion of the substrate on which the YAG laser is irradiated.

16. The method of machining the substrate according to claim 1, wherein a condenser optical system for focusing a laser beam at a predetermined depth of the substrate is used for the dividing the substrate by the laser-machining.

17. The method of machining the substrate according to claim 1, wherein the laser beams diverged by a phase grating is irradiated on the substrate to divide the substrate by the laser-machining.

18. A method of manufacturing an element comprising: machining a substrate to cut the substrate into chips while a predetermined dividing line arranged in the lattice shape is set to the second predetermined dividing line according to claim 1, when dividing a plurality of elements arranged in a lattice shape on a substrate.

19. The method of manufacturing the element according to claim 18, wherein an element to be formed as a liquid droplet ejecting head is manufactured.

20. The method of machining a substrate according to claim 1, wherein the second predetermined dividing line ends at the first predetermined dividing line.

* * * * *